(12) United States Patent
Jhothiraman et al.

(10) Patent No.: US 12,205,900 B2
(45) Date of Patent: Jan. 21, 2025

(54) ELECTRONIC DEVICES COMPRISING A COMPRESSIVE DIELECTRIC MATERIAL, AND RELATED SYSTEMS AND METHODS

(71) Applicant: Micron Technology, Inc., Boise, ID (US)

(72) Inventors: Jivaan Kishore Jhothiraman, Meridian, ID (US); Rutuparna Narulkar, Boise, ID (US); Chandra S. Tiwari, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 341 days.

(21) Appl. No.: 17/664,385

(22) Filed: May 20, 2022

(65) Prior Publication Data

US 2023/0378069 A1 Nov. 23, 2023

(51) Int. Cl.
*H01L 23/532* (2006.01)
*H01L 21/768* (2006.01)
*H01L 21/02* (2006.01)
*H10B 69/00* (2023.01)

(52) U.S. Cl.
CPC .. *H01L 23/53295* (2013.01); *H01L 21/76837* (2013.01); *H01L 21/0214* (2013.01); *H01L 21/02164* (2013.01); *H01L 21/0217* (2013.01); *H01L 21/02274* (2013.01); *H10B 69/00* (2023.02)

(58) Field of Classification Search
CPC .......... H01L 21/0214; H01L 21/02164; H01L 21/76837; H01L 23/53295; H10B 43/27
See application file for complete search history.

(56) References Cited

U.S. PATENT DOCUMENTS

| | | | | |
|---|---|---|---|---|
| 10,355,012 | B2* | 7/2019 | Shimabukuro | ... H01L 29/66553 |
| 11,088,017 | B2* | 8/2021 | Matovu | ............. H01L 21/31051 |
| 2016/0141294 | A1* | 5/2016 | Peri | .................... H01L 21/28512 |
| | | | | 438/653 |
| 2016/0149002 | A1* | 5/2016 | Sharangpani | .......... H10B 41/27 |
| | | | | 257/314 |
| 2016/0218059 | A1* | 7/2016 | Nakada | .................. H10B 41/27 |
| 2021/0358868 | A1* | 11/2021 | Jhothiraman | .......... H10B 43/35 |
| 2022/0013530 | A1* | 1/2022 | Jhothiraman | .......... H10B 41/27 |
| 2023/0402387 | A1* | 12/2023 | Sharangpani | .......... H10B 43/10 |
| 2023/0403850 | A1* | 12/2023 | Amano | .................. H10B 43/50 |

* cited by examiner

*Primary Examiner* — Jaehwan Oh
(74) *Attorney, Agent, or Firm* — TraskBritt

(57) ABSTRACT

An electronic device includes a stack structure, the stack structure including at least one deck including tiers of vertically alternating dielectric materials and conductive materials, an opening extending through the at least one deck, a compressive dielectric material disposed on a bottom surface defining the opening and on sidewalls of the tiers defining the opening, and a dielectric material in direct contact with the compressive dielectric material. The dielectric material substantially fills a remainder of the opening. The compressive dielectric material exhibits a horizontal compressive force against the tiers. Related methods and systems are also disclosed.

20 Claims, 9 Drawing Sheets

ELECTRONIC DEVICES COMPRISING A COMPRESSIVE DIELECTRIC MATERIAL, AND RELATED SYSTEMS AND METHODS

TECHNICAL FIELD

The disclosure, in various embodiments, relates generally to the field of electronic devices and electronic device fabrication. More particularly, the disclosure relates to electronic devices including at least one fill material in an opening, and to related methods and systems.

BACKGROUND

A continuing goal of the electronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes transistor/memory cell pillars extending through a stack structure of tiers of alternating dielectric materials and conductive materials. The conductive materials of the tiers function as control gates. Such a configuration permits a greater number of transistors/memory cells to be located in a unit of die area by building the array upwards (e.g., vertically) on a die, as compared to structures with conventional planar (e.g., two-dimensional) arrangements of transistors/memory cells.

During fabrication, openings are formed extending through the stack structure to enable fabrication processes. The openings are subsequently filled with a fill material. However, using conventional fill materials in the openings may result in cracking or delamination of the fill material within the openings, a base material (e.g., a source material) adjacent the openings, and features (e.g., semiconductor features, staircase features) adjacent to the openings, decreasing reliability, durability, and performance of the vertical memory array.

DETAILED DESCRIPTION

Figure 1A:
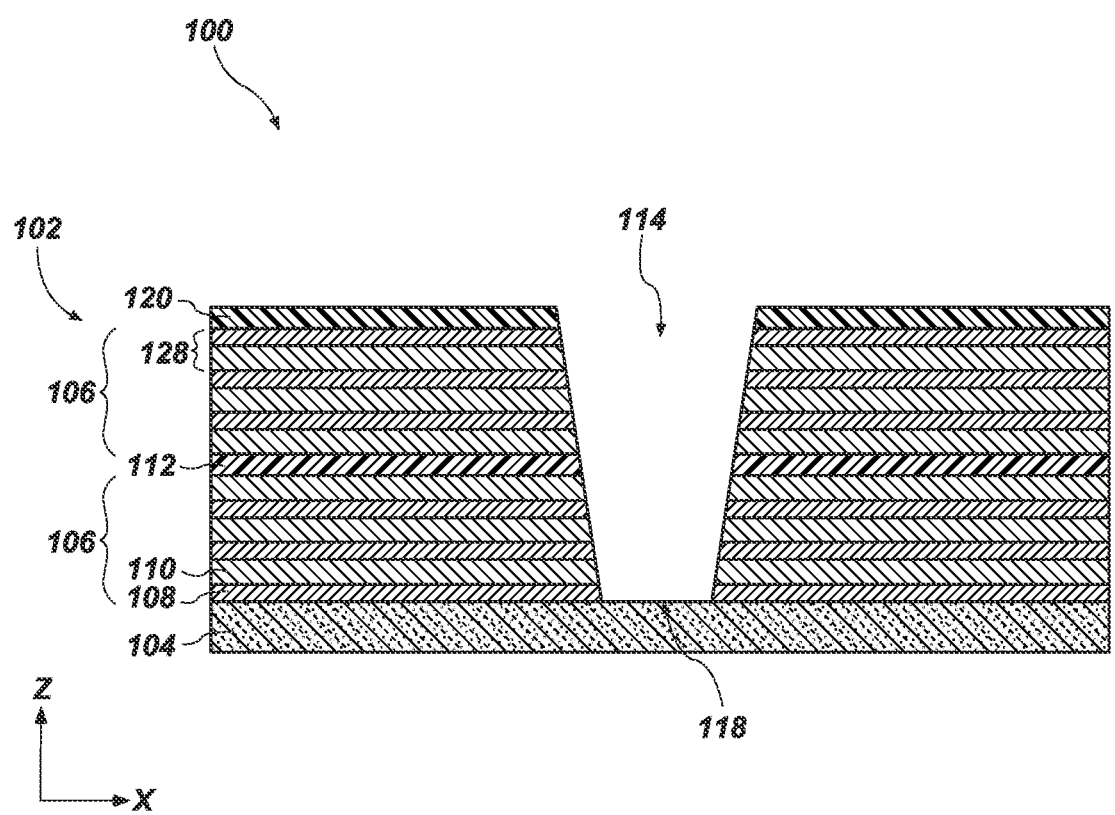
FIGS. 1A through 1D are cross-sectional views at various stages of forming an electronic structure according to embodiments of the disclosure.

An electronic structure (e.g., an apparatus, an electronic device, a semiconductor device, a memory device) that includes an opening (e.g., slit, slot) substantially filled with a compressive dielectric material and a dielectric material and a method of forming the electronic structure is disclosed. The electronic structure includes the opening extending vertically through a stack structure of tiers of vertically alternating dielectric and conductive materials. The compressive dielectric material is disposed on an upper surface of a base material and on the sidewalls of the tiers defining the opening. The compressive dielectric material is formed by a bottom-up fill process resulting in the compressive dielectric material configured to exhibit a horizontally compressive force against the sidewalls of the tiers. A greater thickness of the compressive dielectric material is formed along the upper surface of the base material than on the sidewalls of the tiers. The compressive dielectric material forms a compressive structure, the compressive structure configured to exhibit a horizontally compressive force against the sidewalls of the tiers. The dielectric material is disposed over the compressive dielectric material within the opening.

A configuration of the compressive structure may be selected to achieve desired compression of one or more adjacent semiconductor features present in the stack structure, strengthening a lower region of the tiers and the adjacent semiconductor features. The horizontally compressive force exerted by the compressive structure may advantageously impede cracking and delamination of the dielectric material of the compressive structure, the base material (e.g., source material), and the semiconductor features adjacent to the compressive structure.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic structure, an electronic device, or a complete process flow for manufacturing the electronic structure or the electronic device and the structures described below do not form a complete electronic device. Only those process acts and structures necessary to understand the embodiments described herein are described in detail below. Additional acts to form a complete electronic device may be performed by conventional techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for forming (e.g., depositing) or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shaped depicted in the drawings as a result, for example, of manufacturing techniques and/or tolerances are to be expected. Thus, embodiments described herein are not to be construed as being limited to the particular shapes or regions as illustrated, but include deviations in shapes that results, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the term "configured" refers to a size, shape, material composition, and arrangement of one or more of at least one structure and at least one apparatus facilitating operation of one or more of the structure and the apparatus in a pre-determined way.

As used herein, the term "electronic device" includes, without limitation, a memory device, as well as a semiconductor device, which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "sacrificial," when used in reference to a material or a structure, means and includes a material, structure, or a portion of a material or structure that is formed during a fabrication process but which is removed (e.g., substantially removed) prior to completion of the fabrication process.

As used herein, the term "stack" or "stacks" means and includes a feature having one or more materials vertically adjacent to one another. The stacks may include alternating dielectric materials and conductive materials, such as alternating oxide materials and metal materials or alternative oxide materials and polysilicon materials. Depending on the stage of fabrication of the electronic device containing the stacks, the stacks may alternatively include alternating dielectric materials and nitride materials, such as alternating oxide materials and silicon nitride materials.

As used herein, "conductive material" means and includes an electrically conductive material, such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, a Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and conductively-doped semiconductor material (e.g., conductively-doped polysilicon, conductively-doped germanium (Ge), conductively-doped silicon germanium (SiGe)).

As used herein, "dielectric material" means and includes an electrically insulative material, such as one or more of at least one oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), and a magnesium oxide ($MgO_x$), at least one dielectric nitride material (e.g., a silicon nitride ($SiN_y$)), at least one dielectric oxynitride material (e.g., silicon oxynitride ($SiO_xN_y$)), and at least one dielectric carboxynitride material (e.g., a silicon carboxynitride ($SiO_xC_zN_y$)), where x, y, and z are positive integers.

As used herein, the term "compressive force" means and includes a pushing force (e.g., expansive force, compression). A "compressive force" is exerted in a direction and at a magnitude that is substantially opposite a "tensile force."

As used herein, the term "tensile force" means and includes a pulling force (e.g., tension). A "tensile force" is exerted in a direction and at a magnitude that is substantially opposite a "compressive force."

As used herein, the term "substantially" in reference to a given parameter, property, or condition means and includes to a degree that one of ordinary skill in the art would understand that the given parameter, property, or condition is met with a degree of variance, such as acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

Figure 1B:
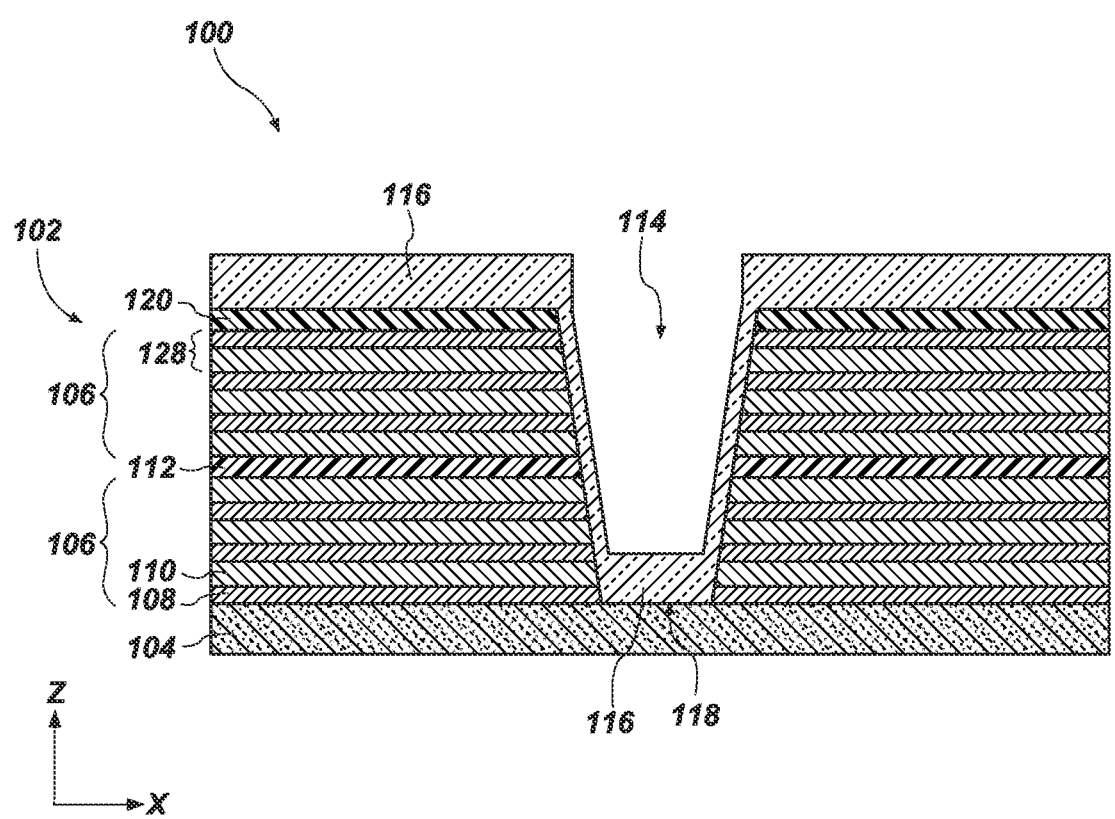
Figure 1C:
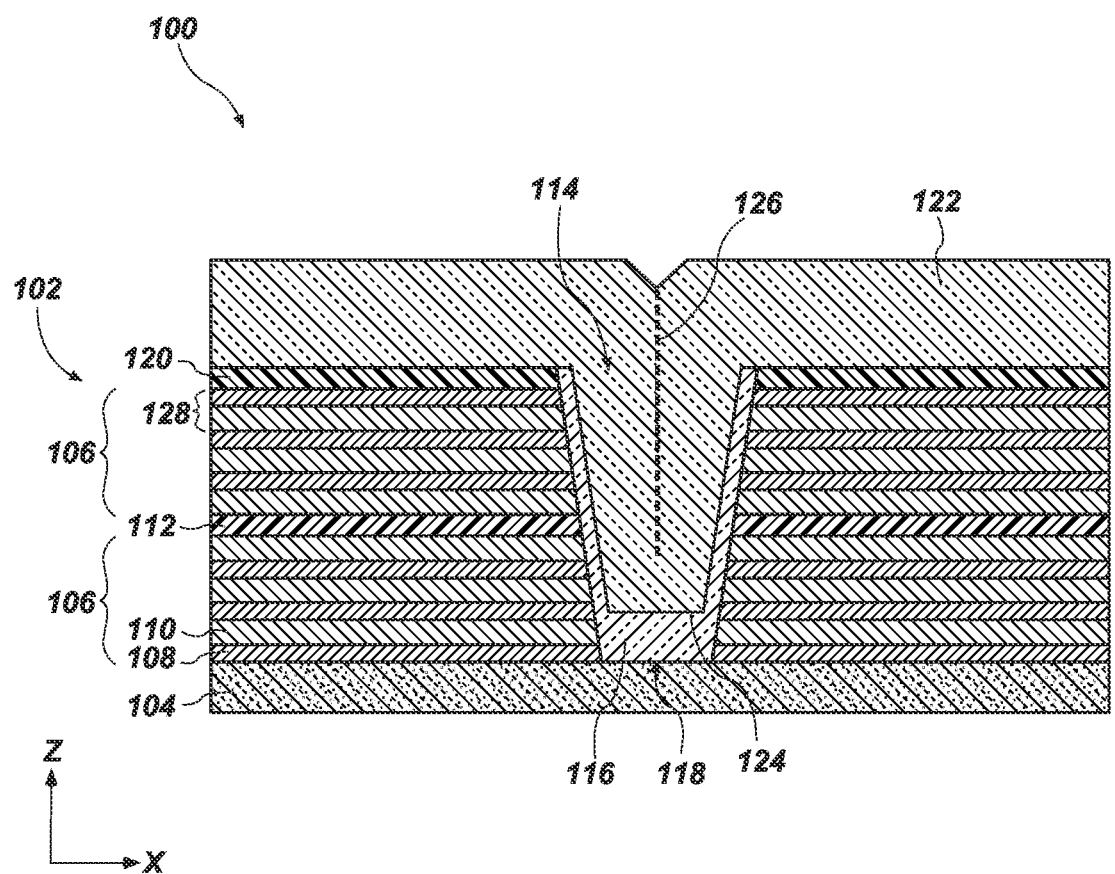
Figure 1D:
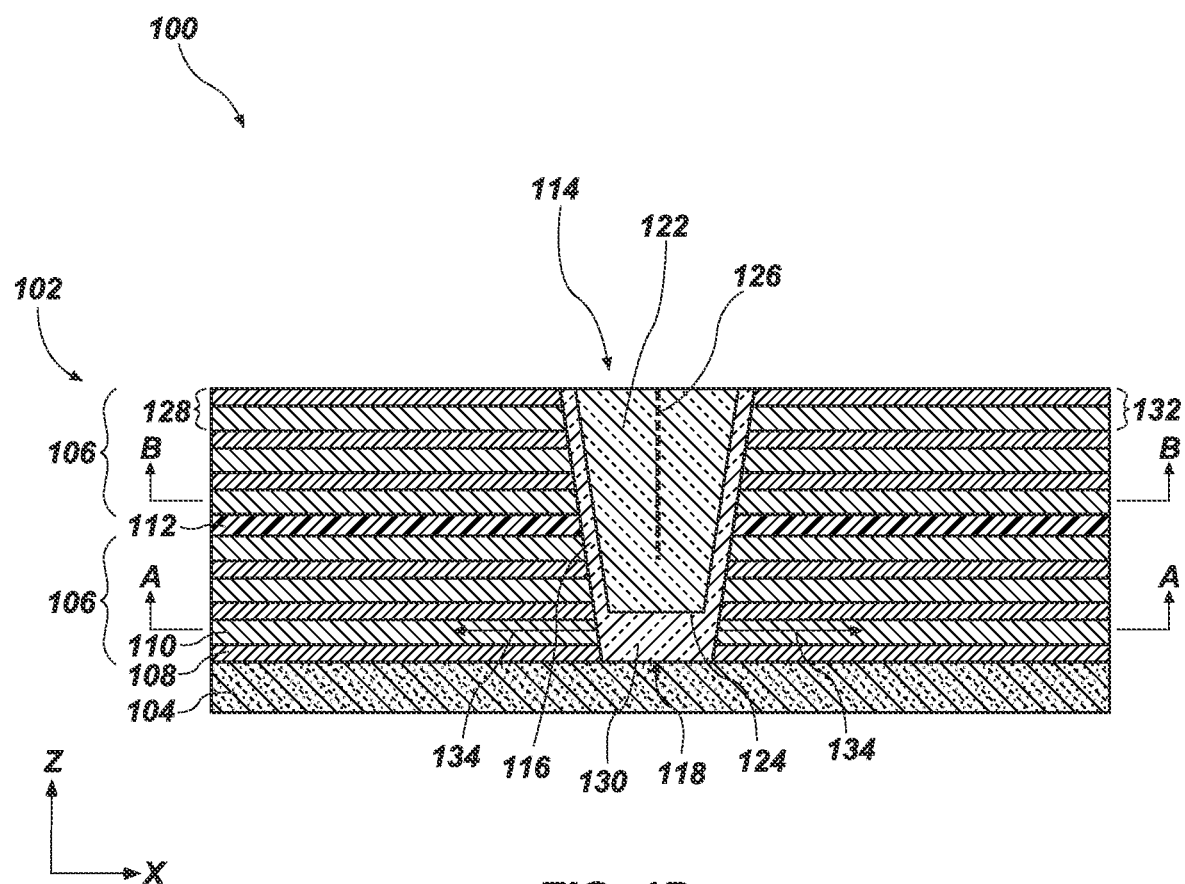
Figure 1E:
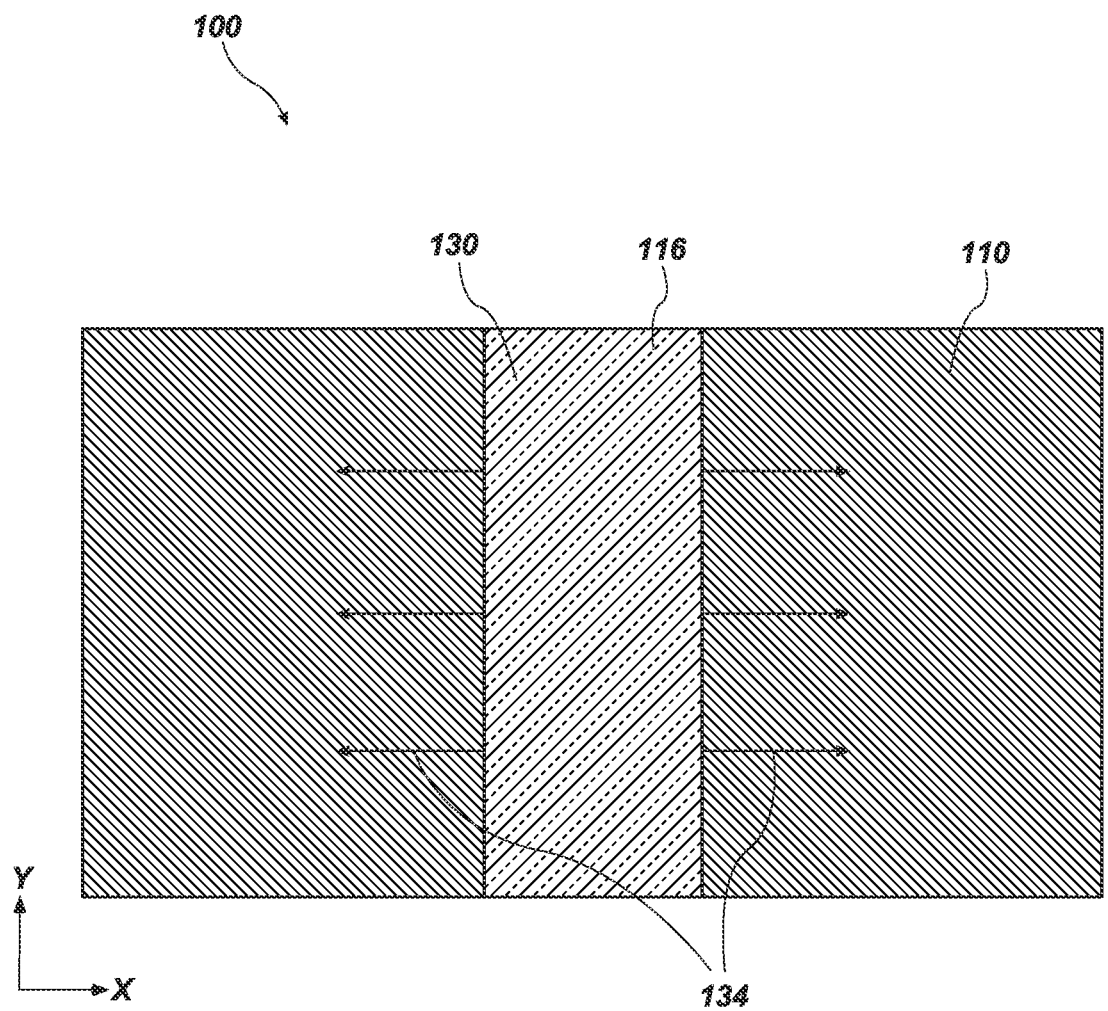
FIG. 1E is a top-down cross-sectional view of the electronic device of FIG. 1D taken along the A-A line.
Figure 1F:
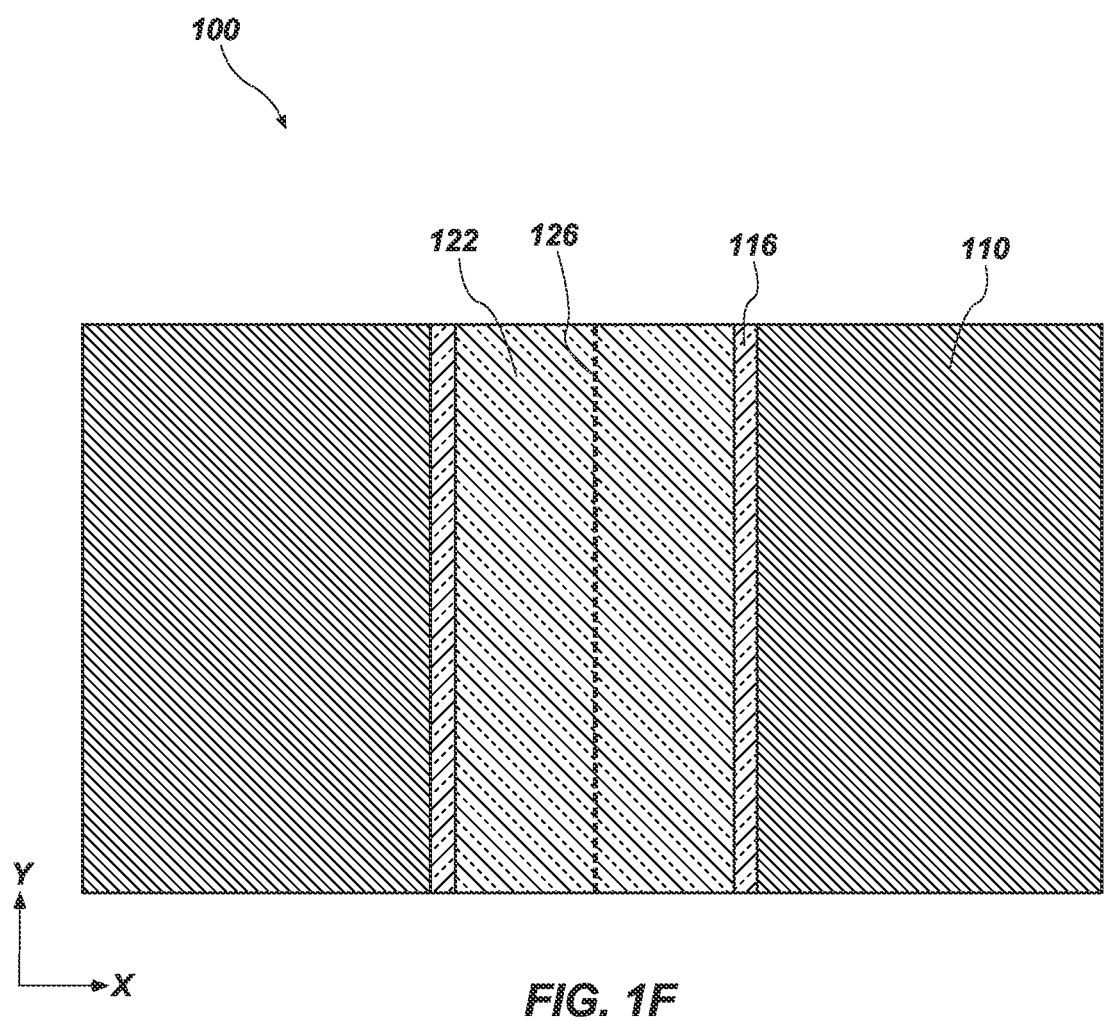
FIG. 1F is a top-down cross-sectional view of the electronic device of FIG. 1D taken along the B-B line.
Figure 2:
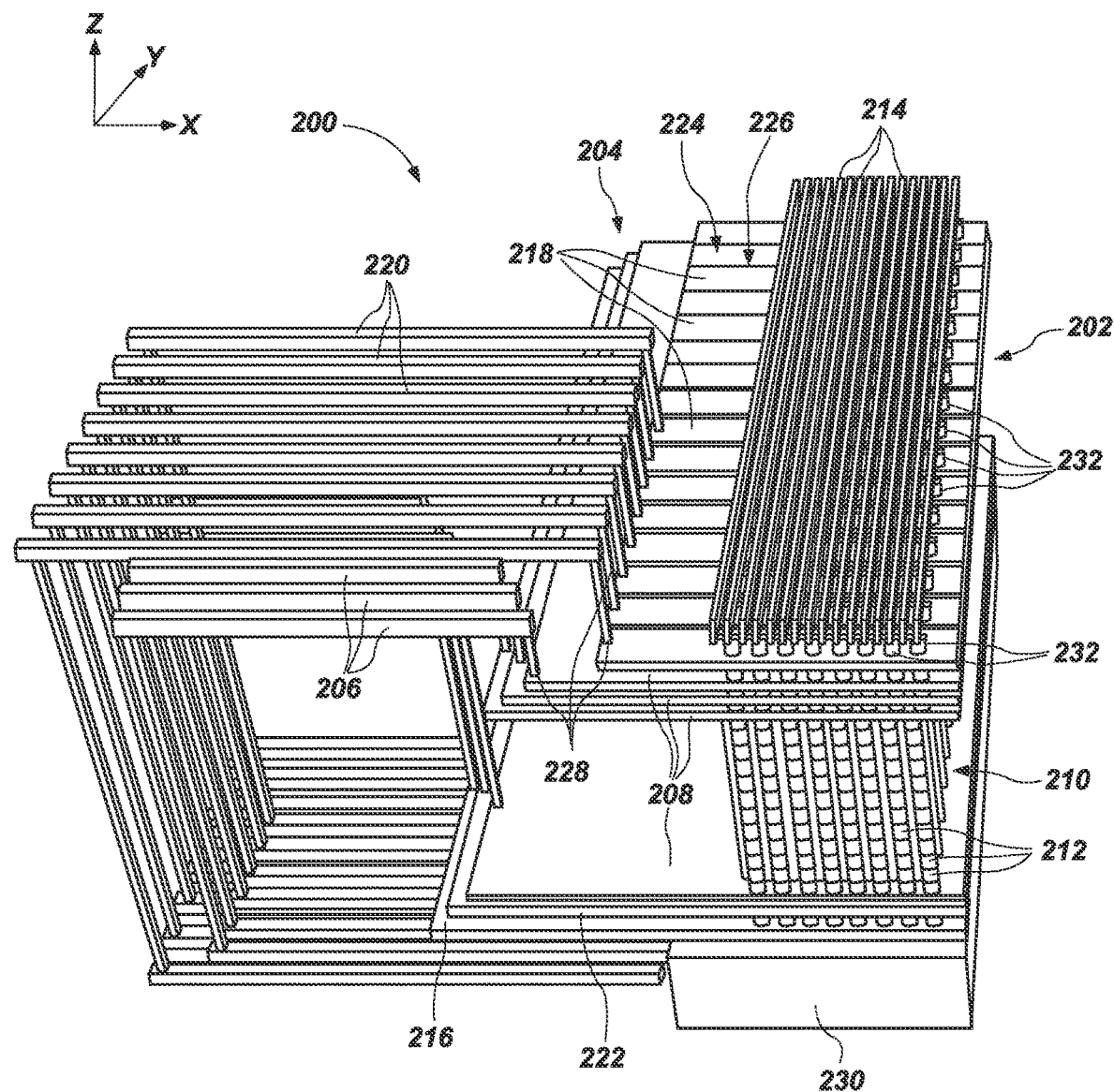
FIG. 2 is a partial cutaway perspective view of an electronic device according to embodiments of the disclosure.

FIGS. 1A through 1F illustrate a method of forming an electric structure at various stages of the method, according to an embodiment of this disclosure. For simplicity, the formation of a single opening is illustrated, but it will be understood by one of ordinary skill in the art that the method may include simultaneously forming multiple (e.g., more than one of, an array of) openings. For convenience in describing FIGS. 1A through 1F, a first direction is defined, shown in FIGS. 1A through 1F, as the X-direction. A second direction, which is transverse (e.g., perpendicular) to the first direction is defined, shown in FIGS. 1A through 1D, as the Z-direction. A third direction, which is transverse to the first and second directions is defined, as shown in FIGS. 1E and 1F, as the Y-direction. Similar directions are defined, as shown in FIG. 2, as discussed in greater detail below.

An electronic structure 100 according to embodiments of the disclosure may be formed as shown in FIGS. 1A through 1D, which are cross-sectional views of the electronic structure 100 during fabrication. Referring to FIG. 1A, a stack structure 102 may be formed to include one or more decks 106 overlying a base material 104. The base material 104 may, for example, include a conductive material, such as a source, adjacent to a substrate. Each of the one or more decks 106 may include vertically (e.g., in the Z-direction) alternating dielectric materials 108 and conductive materials 110. A vertically adjacent dielectric material 108 and conductive material 110 form a tier 128. The one or more decks 106 may be formed using one or more conventional material processes, which are not described in detail herein. While FIGS. 1A through 1D illustrate two decks 106 for simplicity, additional decks 106 may be present. An inter-deck region 112 may be formed between at least a portion of the one or more decks 106. The inter-deck region 112 may be formed from and include an inter-deck oxide material. The stack structure 102 may include a sacrificial material 120 over (e.g., vertically adjacent to) the one or more decks 106. The tiers 128 including the dielectric materials 108 and conductive materials 110 are vertically adjacent to the base material 104, and the inter-deck region 112 is vertically adjacent to the decks 106.

An opening 114 is formed and vertically extends at least partially through the one or more decks 106. As shown in FIG. 1A, the opening 114 may include an elongated opening (e.g., aperture, via) exhibiting one end at an uppermost surface of the stack structure 102 and another end at a lowermost surface of the stack structure 102. The opening 114 may have any suitable configuration. The opening 114 is defined by sidewalls of the tiers 128 and an upper surface 118 of the base material 104. The opening 114 may extend from the uppermost surface of the stack structure 102 to the lowermost surface of the stack structure 102, exposing the upper surface 118 of the base material 104. The sidewalls of the tiers 128 may be substantially vertical or may be sloped. The opening 114 may be a high aspect ratio (HAR) opening, such as having an HAR of at least about 10:1, at least about 20:1, at least about 50:1, at least about 100:1, at least about 150:1, or at least about 200:1.

Referring to FIG. 1B, a compressive dielectric material 116 is formed over the stack structure 102 and in the opening 114. An optional conformal liner (not depicted) may be formed over the stack structure 102, between the stack structure 102 and the compressive dielectric material 116. The compressive dielectric material 116 may be formed by a so-called "bottom-up" deposition process that results in a greater thickness of the compressive dielectric material 116 along the upper surface 118 of the base material 104 and the uppermost surface of the stack structure 102 than on the sidewalls of the tiers 128. The compressive dielectric material 116 partially fills the opening 114, such as substantially filling a lower portion of the opening 114. A portion of the compressive dielectric material 116 formed on the sidewalls of the tiers 128 may extend substantially continuously along the sidewalls of the tiers 128. The compressive dielectric material 116 may be formed of and include one or more of polysilicon, silicon nitride, silicon oxynitride, or a dielectric oxide material, such as silicon oxide.

The compressive dielectric material 116 may be configured to provide compressive forces (e.g., horizontally compressive forces) on the tiers 128 and other adjacent features, such as staircase structures. A process of formation of the compressive dielectric material 116 may control the compressive forces provided by the compressive dielectric material 116. In some embodiments, the compressive dielectric material 116 is formed by a high density plasma (HDP) chemical vapor deposition (CVD) process within an inductively coupled plasma (ICP) reactor. Forming the compressive dielectric material 116 by the HDP-CVD process within an ICP reactor results in the compressive dielectric material 116 providing greater compressive forces on the tiers 128 as compared to conventional electronic structure fill materials and processes of formation. The compressive dielectric material 116 may, for example, be a dielectric oxide material formed by the HDP-CVD process that exerts a compressive force on the tiers 128, such as a compressive force of greater than about 150 MPa, greater than about 200 MPa, greater than about 250 MPa, greater than about 300 MPa, or greater than about 350 MPa. Therefore, the electronic structure 100 according to embodiments of the disclosure provides the greater compressive forces, in comparison to a conventional electronic structure that includes a material that may provide small compressive forces, neutral forces, or tensile forces.

A thickness of the portion of the compressive dielectric material 116 on the sidewalls of the tiers 128 may be substantially uniform. The thickness of the portion of the compressive dielectric material 116 on the sidewalls of the tiers may be within a range of from about 30 nm to about 5 microns (μm). For example, the thickness of the portion of the compressive dielectric material 116 on the sidewalls of the tiers may be within a range of from about 30 nm to about 170 nm, from about 30 nm to about 500 nm, from about 30 nm to about 1 μm, from about 30 nm to about 3 μm, from about 100 nm to about 500 nm, from about 500 nm to about 1 μm, from about 500 nm to about 3 μm, from about 500 nm to about 5 μm, from about 1 μm to about 2 μm, from about 1 µm to about 3 µm, from about 1 µm to about 4 µm, from about 2 µm to about 4 µm, from about 2 µm to about 5 µm, from about 3 µm to about 5 µm, or from about 4 µm to 5 µm. The thickness of the portion of the compressive dielectric material 116 on the sidewalls of the tiers may be greater than about 5 µm, depending on a thickness of the compressive dielectric material 116 on the base material 104 and the uppermost surface of the stack structure 102, as described in further detail below.

The thickness of the compressive dielectric material 116 on the base material 104 and the uppermost surface of the stack structure 102 may be greater than the thickness of the compressive dielectric material 116 on the sidewalls of tiers 128. The thickness of the compressive dielectric material 116 on the base material 104 may be substantially uniform. The thickness of the compressive dielectric material 116 on the base material 104 may be within a range of from about 1 µm to about 5 µm. For example, the thickness of the compressive dielectric material 116 may be within a range of from about 1 µm to about 2 µm, from about 1 µm to about 3 µm, from about 1 µm to about 4 µm, from about 2 µm to about 4 µm, from about 2 µm to about 5 µm, from about 3 µm to about 5 µm, or from about 4 µm to about 5 µm. In some embodiments, the thickness of the compressive dielectric material 116 on the base material is greater than about 5 µm. The compressive dielectric material 116 may substantially fill a portion of the volume of the opening 114. For example, the compressive dielectric material 116 may fill up to about 50% of the volume of the opening 114, up to about 60% of the volume of the opening 114, up to about 75% of the volume of the opening 114, up to about 90% of the volume of the opening 114, up to about 99% of the volume of the opening 114, or up to about 100% of (e.g., substantially completely fill) the volume of the opening 114. A ratio of the thickness of the compressive dielectric material 116 on the upper surface 118 of the base material 104 to the thickness of the compressive dielectric material 116 on the sidewalls of tiers 128 is within a range of from about 1:1 to about 30:1.

Referring to FIG. 1C, an upper portion of the compressive dielectric material 116 over the uppermost surface of the stack structure 102 may be removed. In some embodiments, substantially all of the compressive dielectric material 116 over the uppermost surface of the stack structure 102 is removed. Removal of the upper portion of the compressive dielectric material 116 over the uppermost surface of the stack structure 102 may be accomplished by any suitable technique. The removal process may be selected depending on the material(s) of the compressive dielectric material 116. For example, the upper portion of the compressive dielectric material 116 may be removed by chemical mechanical polishing (CMP). Alternatively, the upper portion of the compressive dielectric material 116 may be removed by conventional etch chemistries and etch conditions. The etch chemistries and etch conditions may be selected depending on the material(s) of the compressive dielectric material 116. The sacrificial material 120 may also be removed from the stack structure 102 at substantially the same time as or after removing the upper portion of the compressive dielectric material 116.

After removing the upper portion of the compressive dielectric material 116, a dielectric material 122 is formed over the stack structure 102 and within the opening 114. The dielectric material 122 is formed by a different formation process than the compressive dielectric material 116. The dielectric material 122 may, for example, be conformally formed. The dielectric material 122 may exhibit the same material composition as or a different material composition than the compressive dielectric material 116. The dielectric material may be formed of and include one or more of polysilicon, silicon nitride, silicon oxynitride, and a dielectric oxide material, such as silicon oxide. The dielectric material 122 may directly contact the compressive dielectric material 116 along an interface 124 within the opening 114, as shown in FIG. 1C. The interface 124 between the compressive dielectric material 116 and the dielectric material 122 may be present along the tiers 128 and above an upper surface of the horizontally oriented portion of the compressive dielectric material 116. By conformally forming the dielectric material 122, the dielectric material 122 may substantially fill (e.g., substantially completely fill) a remainder of the opening 114 vertically adjacent to the compressive dielectric material 116. The dielectric material 122 may also extend over the uppermost surface of the stack structure 102. While FIG. 1C illustrates the dielectric material 122 as a single material, the dielectric material 122 may include multiple conformal dielectric material portions (e.g., layers; not depicted). The conformal dielectric material portions of the dielectric material 122 may exhibit different thicknesses.

The dielectric material 122 may be formed by any suitable conformal deposition technique, such as by a conventional CVD process using conventional processing equipment. In some embodiments, the dielectric material 122 is formed by a sub-atmospheric CVD (SACVD) process in which the CVD process is performed at a pressure lower than atmospheric pressure. In some embodiments, the dielectric material 122 is a silicon oxide material formed using tetraethoxysilane ($Si(OC_2H_5)_4$) (TEOS) and ozone ($O_3$) by a SACVD process. Depending on the deposition conditions used, the conformal dielectric material portions of the dielectric material 122 may also exhibit varying levels of densification. The one or more conformal dielectric material portions of the dielectric material 122 may be formed by multiple sequential deposition processes, with each deposition forming from about 500 Å to about 1000 Å of the dielectric material 122. The dielectric material 122 may provide from about 100 MPa of compressive force to about 180 MPa of tensile force to the tiers 128. For example, the dielectric material 122 may provide a small compressive force of less than about 100 MPa to the tiers 128. In some embodiments, the dielectric material 122 provides a tensile force to the tiers 128, such as a tensile force of greater than about 0 MPa, greater than about 20 MPa, greater than about 50 MPa, greater than about 80 MPa, greater than about 100 MPa, greater than about 120 MPa, or greater than about 180 MPa.

During the formation of the dielectric material 122 over the stack structure 102 and within the opening 114, a seam 126 may form. Since the dielectric material 122 is highly conformal, the remainder of the opening 114 may be filled from the bottom of the opening 114 to the top of the opening 114, with the seam 126 positioned above the lower portion of the compressive dielectric material 116. In addition, no so-called "bread loafing" and little or no pinching off of the dielectric material 122 may occur in the opening 114. The seam 126 may have a length that vertically extends into the dielectric material 122 from an uppermost surface of the dielectric material 122. One end of the seam 126 may be at the uppermost surface of the dielectric material 122 and another end within the opening 114, above the compressive dielectric material 116 disposed along the upper surface 118 of the base material 104. The another end of the seam 126 may be positioned above the compressive dielectric material 116 by at least about 1 µm, at least about 2 µm, at least about 3 μm, at least about 4 μm, or at least about 5 μm. The seam 126, therefore, does not extend into the compressive dielectric material 116. The length of the seam 126 may vary depending on the thickness of the compressive dielectric material 116 formed on the upper surface 118 of the base material 104.

Referring to FIG. 1D, after formation of the dielectric material 122, an upper portion of the dielectric material 122 over the uppermost surface of the stack structure 102 may be removed. For example, substantially all of the dielectric material 122 above the uppermost surface of the stack structure 102 is removed. Removal of the upper portion of the dielectric material 122 may be accomplished by any suitable technique. For example, the upper portion of the dielectric material 122 may be removed by CMP or by conventional etch chemistries and conditions. The sacrificial material 120 may also be removed from the stack structure 102 before, at substantially the same time as, or after removing the upper portion of the dielectric material 122. After removal of the upper portion of the dielectric material 122 and the sacrificial material 120, an uppermost surface of the dielectric material 122 may be substantially coplanar with an uppermost tier 132 of the stack structure 102. An uppermost surface of the compressive dielectric material 116 may also be substantially coplanar with the uppermost tier 132 of the stack structure 102 and with the uppermost surface of the dielectric material 122. The compressive structure 130 exerts compressive forces (e.g., horizontally compressive forces), which are indicated by arrows 134, towards the tiers 128.

Additional process acts may be conducted to form features, such as semiconductor features, above or adjacent to the compressive dielectric material 116, the dielectric material 122, and the tiers 128. The features may include, but are not limited to, transistors, capacitors, resistors, contacts, alignment marks, etc. depending on the electronic device to be formed. The features may be formed by conventional processes, which are not described in detail herein. The electronic structure 100 including the dielectric material 122 and the compressive structure 130 of the compressive dielectric material 116 may, for example, be used in a three-dimensional (3D) electronic device. The 3D electronic device may include, but is not limited to, a 3D NAND Flash memory device. The 3D electronic device may, for example, include a staircase structure (see FIG. 2) adjacent to the compressive structure 130. While not illustrated in FIGS. 1A-1D, the staircase structure neighbors the compressive structure 130. The staircase structure may, for example, be located laterally adjacent to the compressive structure 130. The generated compressive forces generated by the compressive structure 130 may, therefore, be exerted not only on the tiers 128 but also on the staircase structure. The 3D electronic device may also be a DRAM device or other electronic device in which a fill material is formed in an opening and in which the compressive dielectric material 116 would reduce or eliminate cracks in the base material 104, in the fill material, and in features adjacent to the base material 104 or the opening 114. Additional process acts may be conducted to form the electronic device (e.g., the 3D NAND Flash memory device) including the electronic structure 100. The additional process acts for fabricating the electronic device may be conducted by conventional techniques, which are not described in detail herein.

Accordingly, a method of forming an electronic device includes forming an opening extending vertically through a stack structure including at least one deck, the at least one deck including vertically alternating dielectric materials and conductive materials, and forming a compressive dielectric material within the opening and over the stack structure, the compressive dielectric material configured to provide compressive forces to the tiers. A greater thickness of the compressive dielectric material is formed along a bottom surface defining the opening and an uppermost surface of the stack structure than on sidewalls of the tiers defining the opening. The method includes forming a dielectric material within the opening.

Referring to FIG. 1D, the electronic structure 100 includes the stack structure 102 with decks 106 overlying the base material 104. However, the electronic structure 100 may include one deck 106. In some embodiments, the electronic structure 100 includes multiple decks 106 (e.g., two or more), with the inter-deck region 112 between the decks 106. The decks 106 include vertically alternating dielectric materials 108 and conductive materials 110, with the compressive dielectric material 116 and the dielectric material 122 extending vertically through the decks 106 to the base material 104. The sidewalls of the tiers 128 defining the opening 114 may be vertical (not depicted) or sloped, as shown in FIG. 1D, and exhibit no retrogrades, such as pinching off points or bread-loafing. The compressive dielectric material 116 is disposed in a bottom portion of the opening 114, along the upper surface 118 of the base material 104 and along the sidewalls of the tiers 128.

FIG. 1E illustrates a simplified partial top-down cross-sectional view of the electronic structure 100 taken along the A-A line of FIG. 1D extending horizontally through the compressive dielectric material 116. Referring to FIG. 1D in combination with FIG. 1E, the compressive dielectric material 116 disposed along the upper surface 118 of the base material 104 and below the interface 124 may form the compressive structure 130 that provides a compressive force. The compressive structure 130 may be present in a lower portion of the opening 114. In some embodiments, the compressive structure 130 exhibits a compressive force horizontally (e.g., in the X direction), indicated by the arrows 134, against the sidewalls of the tiers 128, including the conductive materials 110 and the dielectric material 108. For example, the compressive structure 130 may exert a compressive force of greater than about 100 MPa, greater than about 150 MPa, greater than about 200 MPa, greater than about 250 MPa, greater than about 300 MPa, or greater than about 350 MPa. A configuration of the compressive structure 130 may be selected to achieve desired compression of one or more adjacent features in the stack structure 102. The compressive structure 130 may have an aspect ratio within a range of from about 1:1 to about 10:1. For example, the compressive structure 130 may have an aspect ratio within a range of from about 1:1 to about 2:1, from about 1:1 to about 5:1, from about 1:1 to about 8:1, from about 3:1 to about 5:1, from about 3:1 to about 8:1, from about 3:1 to about 10:1, from about 5:1 to about 8:1, from about 5:1 to about 10:1, or from about 8:1 to about 10:1. The openings 114 may have an aspect ratio of at least about 1:1, at least about 3:1, at least about 5:1, at least about 7:1, or at least about 10:1.

The thickness of the compressive structure 130 in the lower portion of the opening 114 is greater than a thickness of the compressive dielectric material 116 disposed along the sidewalls of the tiers 128. A ratio of the thickness of the compressive structure 130 to the thickness of the compressive dielectric material 116 disposed along the sidewalls of the tiers 128 may be within a range of from about 1:1 to about 30:1, from about 1:1 to about 5:1, from about 1:1 to about 10:1, from about 1:1 to about 20:1, from about 5:1 to about 10:1, from about 5:1 to about 20:1, from about 5:1 to about 30:1, from about 10:1 to about 20:1, from about 10:1 to about 30:1, from about 20:1 to about 30:1, or from about 25:1 to about 30:1. The ratio of the thickness of the compressive dielectric material 116 in the lower portion of the opening 114 to the thickness of the compressive dielectric material 116 along the sidewalls of the tiers 128 may be at least about 1:1, at least about 5:1, at least about 10:1, at least about 15:1, at least about 20:1, at least about 25:1, or at least about 30:1.

FIG. 1F illustrates a simplified partial top-down cross-sectional view of the electronic structure 100 taken along the B-B line of FIG. 1D extending horizontally (e.g., in the X-direction) through the dielectric material 122. Referring to FIG. 1D in combination with FIGS. 1E and 1F, the dielectric material 122 is disposed over the compressive dielectric material 116 in the opening 114, as shown in FIG. 1D. The dielectric material 122 substantially fills (e.g., substantially completely fills) the remainder of the opening 114 above the compressive dielectric material 116. The dielectric material 122 may provide one of a compressive force less than about 100 MPa, a tensile force from about 0 MPa to about 180 MPa, or a tensile force of greater than 180 MPa to the tiers 128, including the conductive materials 110 and the dielectric materials 108. The dielectric material 122 includes one or more conformal dielectric material portions (not depicted). The uppermost surface of the dielectric material 122 is substantially coplanar with the uppermost tier of the stack structure 102. The dielectric material 122 may also include the seam 126, which extends from the uppermost surface of the dielectric material 122 partially into the opening 114 and ends above the compressive structure 130 of the compressive dielectric material 116. The seam 126 does not extend into the compressive dielectric material 116, which is present in the lower portion of the opening 114. Due to its compressibility, the compressive dielectric material 116 mitigates cracking along or adjacent to the seam 126 in the dielectric material 122. Furthermore, since the seam 126 does not extend into the compressive dielectric material 116, cracking originating adjacent to the staircase structure is also mitigated by the compressive properties of the compressive dielectric material 116 and the compressive structure 130. Therefore, while the seam 126 may be present in the dielectric material 122, the compressive dielectric material 116 does not include the seam 126.

The compressive force exerted by the compressive structure 130 may strengthen lower regions of the tiers 128, the one or more adjacent features, and the base material 104 and reduce cracking or delamination of the dielectric material 122 within the opening 114, the one or more adjacent features, and the base material 104. Increased strength, durability, and reliability of the electronic structure 100 due to the compressive structure 130 is achieved without a degradation in performance of the electronic structure 100. The compressive forces exerted by the compressive structure 130 may, for example, strengthen regions of the electronic structure 100 adjacent to the staircase structure, such as lower regions of the staircase structure.

Accordingly, an electronic device includes a stack structure, the stack structure including at least one deck including tiers of vertically alternating dielectric materials and conductive materials, an opening extending through the at least one deck, a compressive dielectric material disposed on a bottom surface defining the opening and on sidewalls of the tiers defining the opening, and a dielectric material in direct contact with the compressive dielectric material. The dielectric material substantially fills a remainder of the opening. The compressive dielectric material exhibits a horizontal compressive force against the tiers.

Accordingly, an electronic device includes a stack structure, the stack structure including one or more decks including tiers of vertically alternating dielectric materials and conductive materials. A compressive structure is laterally adjacent to a lower portion of the tiers and in contact with the tiers. The compressive structure is configured to exert a compressive force greater than about 150 MPa against the tiers. The electronic device includes a dielectric material contacting the compressive structure.

FIG. 2 illustrates a partial cutaway perspective view of a portion of an electronic device 200 (e.g., a microelectronic device, a memory device, such as a 3D NAND Flash memory device) including an electronic structure 202. The electronic structure 202 may be substantially similar to the electronic structure 100 including the compressive structure 130 previously described with reference to FIGS. 1A-1F. For convenience in describing FIG. 2, a first direction is defined as the X-direction. A second direction, which is transverse (e.g., perpendicular) to the first direction is defined as the Y-direction. A third direction, which is transverse to the first and second directions is defined as the Z-direction.

As shown in FIG. 2, the electronic device 200 may include a staircase structure 204 defining contact regions for connecting access lines 206 to conductive structures 208 (e.g., corresponding to the conductive materials 110 (FIG. 1D)). The electronic structure 202 may include vertical strings 210 of memory cells 212 that are coupled to each other in series. The vertical strings 210 may extend vertically (e.g., in the Z-direction) and orthogonally to conductive lines and the conductive structures 208, such as data lines 214, a source tier 216, first select gates 218 (e.g., upper select gates, drain select gates (SGDs)), select lines 220, and a second select gate 222 (e.g., a lower select gate, a source select gate (SGS)). The first select gates 218 may be horizontally divided in the second direction (e.g., in the Y-direction) into multiple blocks 224 horizontally separated from one another by slots 226.

Vertical conductive contacts 228 may electrically couple components to each other as shown. For example, the select lines 220 may be electrically coupled to the first select gates 218 and the access lines 206 may be electrically coupled to the conductive structures 208. The electronic device 200 may also include a control unit 230 positioned under the memory array, which may include at least one of string driver circuitry, pass gates, circuitry for selecting gates, circuitry for selecting conductive lines (e.g., the data lines 214, the access lines 206), circuitry for amplifying signals, and circuitry for sending signals. The control unit 230 may be electrically coupled to the data lines 214, the source tier 216, the access lines 206, the first select gates 218, and the second select gate 222, for example. In some embodiments, the control unit 230 includes CMOS (complementary metal-oxide-semiconductor) circuitry. In such embodiments, the control unit 230 may be characterized as having a "CMOS under Array" ("CuA") configuration.

The first select gates 218 may extend horizontally in a first direction (e.g., the X-direction) and may be coupled to respective first groups of vertical strings 210 of memory cells 212 at a first end (e.g., an upper end) of the vertical strings 210. The second select gate 222 may be formed in a substantially planar configuration and may be coupled to the vertical strings 210 at a second, opposite end (e.g., a lower end) of the vertical strings 210 of memory cells 212.

The data lines 214 (e.g., digit lines, bit lines) may extend horizontally in a second direction (e.g., in the Y-direction) that is at an angle (e.g., perpendicular) to the first direction (e.g., the X-direction) in which the first select gates 218 extend. Individual data lines 214 may be coupled to individual groups of the vertical strings 210 extending in the second direction (e.g., the Y-direction) at the first end (e.g., the upper end) of the vertical strings 210 of the individual groups. Additional individual groups of the vertical strings 210 extending in the first direction (e.g., the X-direction) and coupled to individual first select gates 218 may share a particular vertical string 210 thereof with individual groups of vertical strings 210 coupled to an individual data line 214. Thus, an individual vertical string 210 of memory cells 212 may be selected at an intersection of an individual first select gate 218 and an individual data line 214. Accordingly, the first select gates 218 may be used for selecting memory cells 212 of the vertical strings 210 of memory cells 212.

The conductive structures 208 (e.g., word lines) may extend in respective horizontal planes. The conductive structures 208 may be stacked vertically, such that each conductive structure is coupled to at least some of the vertical strings 210 of memory cells 212, and the vertical strings 210 of the memory cells 212 extend vertically through the stack structure (e.g., the stack structure 102) including the conductive structures 208. The conductive structures 208 may be coupled to or may form control gates of the memory cells 212.

The first select gates 218 and the second select gate 222 may operate to select a vertical string 210 of memory cells 212 interposed between data lines 214 and the source tier 216. Thus, an individual memory cell 212 may be selected and electrically coupled to a data line 214 by operation of (e.g., by selecting) the appropriate first select gate 218, second select gate 222, and conductive structure 208 that are coupled to the particular memory cell 212.

The staircase structure 204 may be configured to provide electrical connection between the access lines 206 and the conductive structures 208 through the vertical conductive contacts 228. In other words, an individual conductive structure 208 may be selected via an access line 206 in electrical communication with a respective vertical conductive contact 228 in electrical communication with the conductive structure 208. The data lines 214 may be electrically coupled to the vertical strings 210 of memory cells 212 through conductive contact structures 232.

Figure 3:
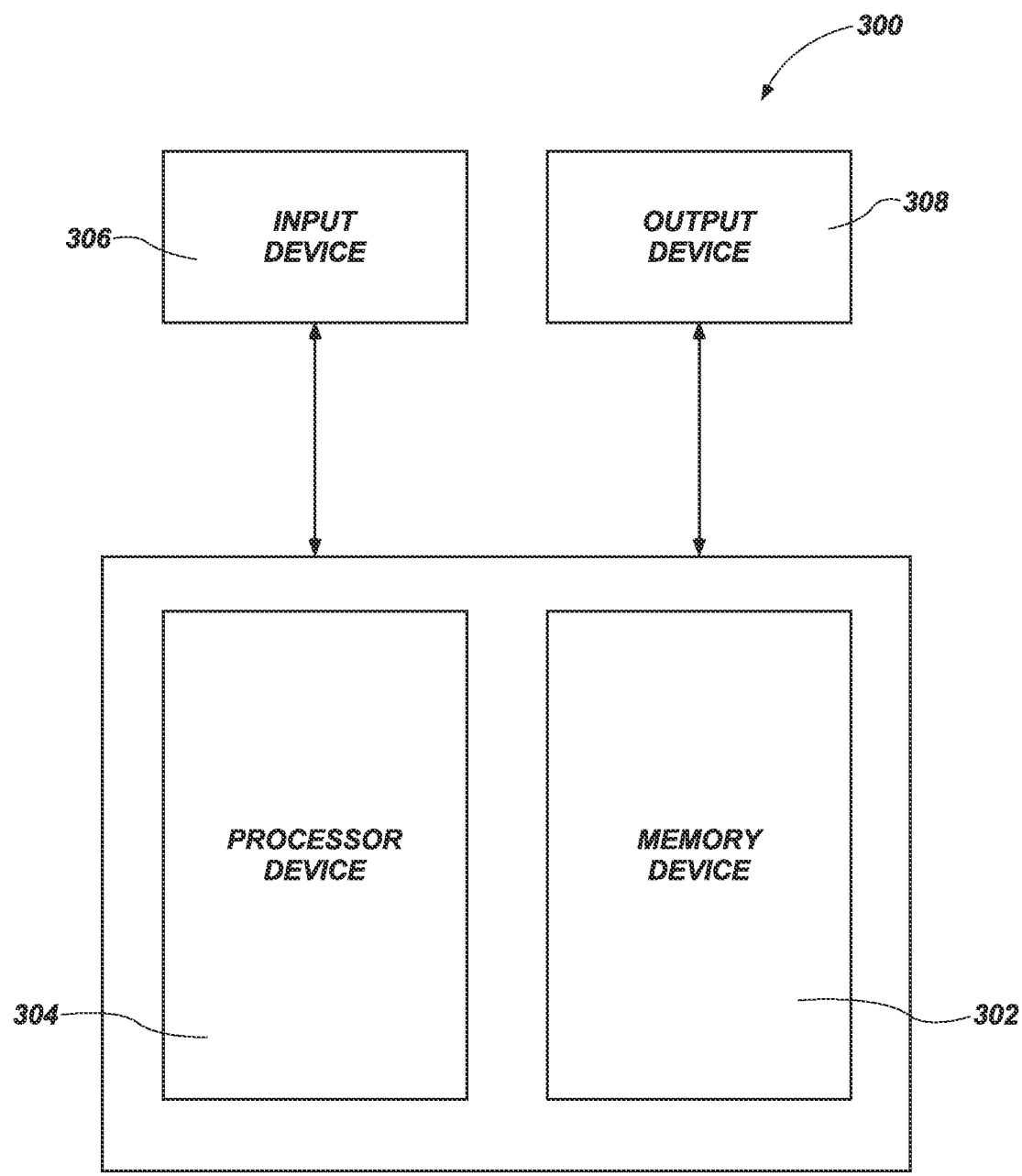
FIG. 3 is a schematic block diagram of an electronic system according to embodiments of the disclosure.

Electronic devices (e.g., the electronic device 200) including one or more electronic structures (e.g., the electronic structure 100) including the compressive dielectric material 116 and the compressive bottom structure 130, according to embodiments of the disclosure may be used in embodiments of electronic systems of the disclosure. For example, FIG. 3 is a block diagram of an electronic system 300 implemented according to one or more embodiments described herein. The electronic system 300 may include, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may include, for example, the electronic structure previously described herein (e.g., the electronic structure 100 previously described with reference to FIGS. 1A-1F) including the compressive dielectric material 116 and the compressive structure 130.

The electronic system 300 may further include at least one electrical signal processor device 304 (e.g., a processor or a microprocessor). The electrical signal processor device 304 may, optionally, include at least one electronic structure 100 according to embodiments of the disclosure. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may include a single device that can be used both to input information to the electronic system 300 and to output information to a user. For example, the input device 306 and the output device 308 may include a single touchscreen device that can input information from a user to the electronic system 300 and output visual information to a user. The one or more input devices 306 and the output devices 308 may communicate electrically with at least one of the memory device 302 and the processor device 304.

Figure 4:
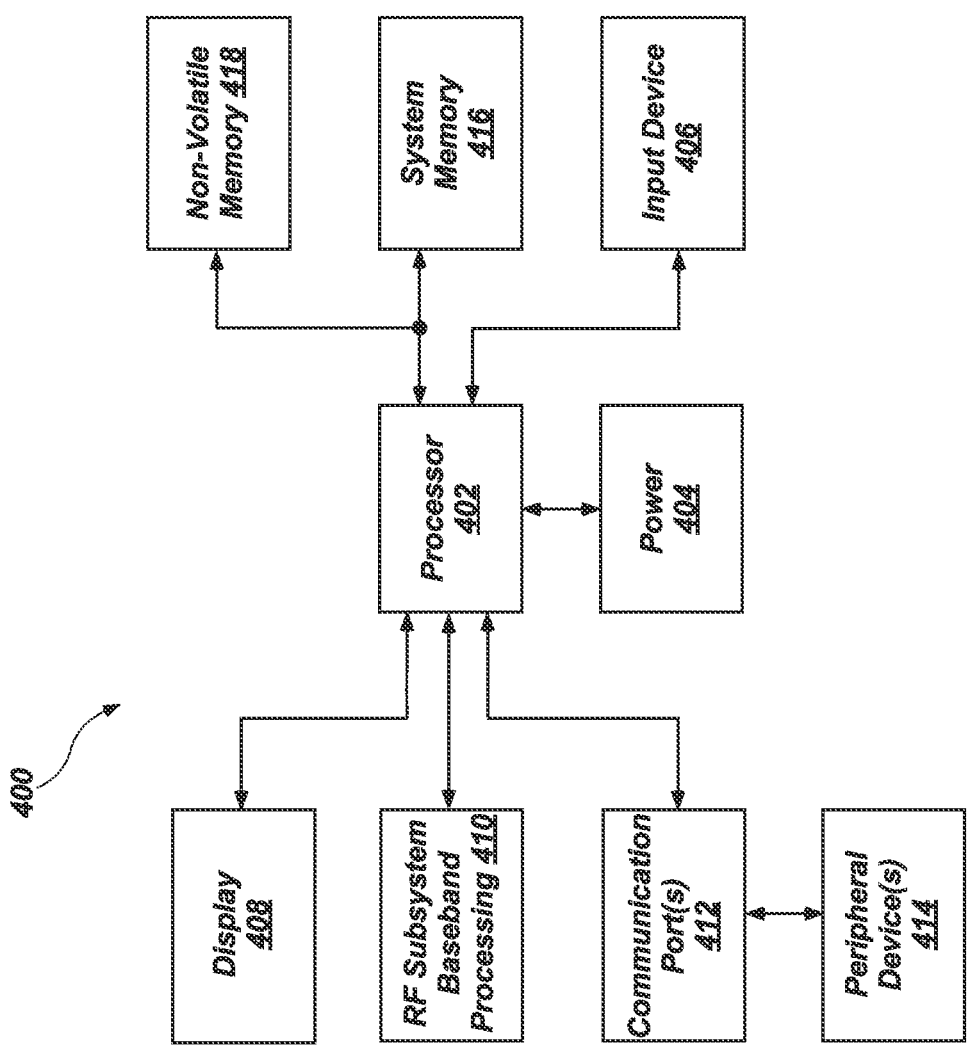
FIG. 4 is a schematic block diagram of a process-based system according to embodiments of the disclosure.

With reference to FIG. 4, a processor-based system 400 is depicted. The processor-based system 400 may include various electronic structures (e.g., the electronic structure 100) manufactured in accordance with embodiments of the disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include electronic structures (e.g., the electronic structure 100) or electronic devices (e.g., the electronic device 200) manufactured in accordance with embodiments of the disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, and LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not depicted). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include electronic structures, such as the electronic structures (e.g., the electronic structure 100) according to the embodiments of the disclosure, or a combination thereof.

The processor 402 may also be coupled to non-volatile memory 418. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as a disk drive memory, such as a hybrid-drive including resistive memory or other types of non-volatile solid-state memory, for example. The non-volatile memory 418 may include electronic structures, such as the electronic structures (e.g., the electronic structure 100) according to the embodiments of the disclosure, or a combination thereof.

Accordingly, a system includes a processor operably coupled to an input device and an output device and a memory device operably coupled to the processor, the memory device including at least one electronic device. The at least one electronic device includes a stack structure including decks over a base material, the decks including tiers of vertically alternating dielectric and conductive materials, and an opening extending through the decks and to the base material. A compressive dielectric material is disposed within the opening and on the base material, the compressive dielectric material laterally adjacent to a lower region of the tiers. A dielectric material is vertically adjacent to the compressive dielectric material. The compressive dielectric material exerts a compressive force on the tiers.

The electronic structures 100, electronic devices 200, and systems 300 and 400 of the disclosure advantageously facilitate one or more of increased structural strength, improved durability and reliability, and decreased cracking as compared to conventional structures, conventional devices, and conventional systems. By including the compressive dielectric material 116 in the lower portion of the opening 114 and the dielectric material 122 over the compressive dielectric material 116, cracking in the electronic structure 100 and the electronic device 200 may be substantially reduced or eliminated. More specifically, cracking in and around the dielectric material 122 may be substantially reduced or eliminated, which enables a large volume of the dielectric material 122 to be present in the opening 114 while still reducing cracking and stress in other regions of the electronic structures 100 and the electronic devices 200. Cracking in and around the staircase structure 204 may also be substantially reduced or eliminated by including the compressive dielectric material 116 in the lower portion of the opening 114. In addition, by forming the compressive dielectric material 116 in the lower portion of the opening 114 and the dielectric material 122 over the compressive dielectric material 116 according to embodiments of the disclosure, existing equipment may be used to form the electronic structures 100 and the electronic devices 200. The methods of the disclosure facilitate the formation of devices (e.g., apparatuses, semiconductor devices, electronic devices, memory devices) and systems (e.g., electronic systems) having one or more of improved performance, reliability, and durability, lower costs, and increased yield as compared to conventional devices (e.g., conventional apparatuses, conventional semiconductor devices, conventional microelectronic devices, conventional memory devices) and conventional systems (e.g., conventional electronic systems).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming an electronic device, the method comprising:
    forming an opening extending vertically through a stack structure comprising at least one deck, the at least one deck comprising tiers of vertically alternating dielectric materials and conductive materials;
    forming a compressive dielectric material within the opening and over the stack structure, the compressive dielectric material configured to provide compressive forces to the tiers, and a greater thickness of the compressive dielectric material formed along a bottom surface defining the opening and an uppermost surface of the stack structure than on sidewalls of the tiers defining the opening; and
    forming a dielectric material within the opening.

2. The method of claim 1, further comprising planarizing the dielectric material, such that an upper surface of the dielectric material is substantially coplanar with an uppermost tier of the at least one deck.

3. The method of claim 1, wherein forming a compressive dielectric material comprises forming a compressive structure in a lower portion of the opening, the compressive structure configured to exhibit compressive forces against the tiers.

4. The method of claim 3, further comprising forming one or more additional features in the stack structure adjacent to the opening and selecting a configuration of the compressive structure to exert compressive forces on the one or more additional features.

5. The method of claim 1, wherein forming a compressive dielectric material comprises forming the compressive dielectric material by a high density plasma (HDP) chemical vapor deposition (CVD) process.

6. The method of claim 1, wherein forming a dielectric material comprises forming one or more conformal dielectric material portions within the opening by a sub-atmospheric CVD process.

7. The method of claim 1, wherein forming a compressive dielectric material comprises forming the compressive dielectric material within the opening at a thickness of at least about 1 µm.

8. The method of claim 1, wherein forming a dielectric material within the opening comprises forming the dielectric material substantially filling a remainder of the opening.

9. An electronic device, comprising:
a stack structure comprising:
at least one deck comprising tiers of vertically alternating dielectric materials and conductive materials;
an opening extending through the at least one deck;
a compressive dielectric material on a bottom surface defining the opening and on sidewalls of the tiers defining the opening; and
a dielectric material in direct contact with the compressive dielectric material, the dielectric material substantially filling a remainder of the opening,
wherein the compressive dielectric material exhibits a horizontal compressive force against the tiers.

10. The electronic device of claim 9, wherein a thickness of the compressive dielectric material on the bottom surface is greater than a thickness of the compressive dielectric material on the sidewalls of the tiers.

11. The electronic device of claim 9, wherein the compressive dielectric material is configured to exert a horizontal compressive force greater than about 150 MPa against the tiers.

12. The electronic device of claim 11, further comprising one or more additional features adjacent to the opening, the compressive dielectric material formulated and configured to provide horizontal compression of the one or more additional features.

13. The electronic device of claim 9, wherein the compressive dielectric material extends substantially continuously along the sidewalls of the tiers.

14. The electronic device of claim 9, wherein the compressive dielectric material substantially fills a lower portion of the opening.

15. An electronic device, comprising:
a stack structure comprising:
one or more decks comprising tiers of vertically alternating dielectric materials and conductive materials;
a compressive structure laterally adjacent to a lower portion of the tiers and in contact with the tiers, the compressive structure configured to exert a compressive force greater than about 150 MPa against the tiers; and
a dielectric material contacting the compressive structure.

16. The electronic device of claim 15, wherein a thickness of the compressive structure is at least about 1 µm.

17. The electronic device of claim 15, further comprising a seam in the dielectric material, the seam extending vertically from an upper surface of the dielectric material and into the dielectric material.

18. A system, comprising:
a processor operably coupled to an input device and an output device; and
a memory device operably coupled to the processor and comprising at least one electronic device, the at least one electronic device comprising:
a stack structure comprising decks over a base material, the decks comprising tiers of vertically alternating dielectric and conductive materials;
an opening extending through the decks and to the base material;
a compressive dielectric material within the opening and on the base material, the compressive dielectric material laterally adjacent to a lower region of the tiers; and
a dielectric material vertically adjacent to the compressive dielectric material,
wherein the compressive dielectric material exerts a compressive force on the tiers.

19. The system of claim 18, wherein a portion of the compressive dielectric material is on sidewalls of the tiers and a thickness of the portion of the compressive dielectric material on the sidewalls of the tiers is less than a thickness of the compressive dielectric material on the base material.

20. The system of claim 19, wherein a ratio of the thickness of the compressive dielectric material on the base material to the thickness of the compressive dielectric material on the sidewalls of the tiers is from about 1:1 to about 30:1.

* * * * *